United States Patent [19]

Hutter et al.

[11] Patent Number: 4,855,244

[45] Date of Patent: Aug. 8, 1989

[54] METHOD OF MAKING VERTICAL PNP TRANSISTOR IN MERGED BIPOLAR/CMOS TECHNOLOGY

[75] Inventors: Louis N. Hutter, Richardson; Joe R. Trogolo, Plano, both of Tex.

[73] Assignee: Texas Instruments Incorporated, Dallas, Tex.

[21] Appl. No.: 69,358

[22] Filed: Jul. 2, 1987

[51] Int. Cl.[4] .................... H01L 21/265; B01J 17/00
[52] U.S. Cl. ........................ 437/31; 357/34; 357/42; 357/91; 437/34; 437/54; 437/55; 437/56
[58] Field of Search ............... 437/31, 34, 54, 55, 437/56; 357/34, 42, 91

[56] References Cited

U.S. PATENT DOCUMENTS

| | | | |
|---|---|---|---|
| 4,403,395 | 9/1983 | Curran | 437/31 |
| 4,484,388 | 11/1984 | Iwasaki | 437/31 |
| 4,507,847 | 4/1985 | Sullivan | 437/31 |
| 4,624,046 | 11/1986 | Shideler et al. | 437/31 |
| 4,641,419 | 2/1987 | Kudo | 437/31 |
| 4,717,686 | 1/1988 | Jacobs et al. | 437/31 |
| 4,721,684 | 1/1988 | Musumeci | 437/31 |

OTHER PUBLICATIONS

Gray et al., "Analysis and Design of Analog Integrated Circuits", John Wiley & Sons, 1977, pp. 91–99.
J. Lapham et al., "A Complementary Bipolar Process for High Speed Precision Linear Circuits", pub. in Proceedings of the 1986 Bipolar Circuits and Technology Meeting, IEEE, Sep. 11–12, 1986, pp. 31–32.

Primary Examiner—Upendra Roy
Attorney, Agent, or Firm—Thomas R. FitzGerald; Leo N. Heiting; Melvin Sharp

[57] ABSTRACT

A vertical PNP structure for use in a merged bipolar/CMOS technology has a P+ buried layer (84) as a collector region, which is isolated from the P substrate (48) by an N− buried layer (82). The P+ buried layer (84) diffuses downwards into the N− buried layer (82) and upwards into a P− epitaxy layer (52d) and into a base region (54c). The base region (54c) is formed in the same processing step as the N well region (54b) of the PMOS transistor (42) and the collection region (54a) of the NPN transistor (40). By diffusing into the base region (54c), the width between the collector (84) and emitter (64e) is reduced. The emitter (64e) can be formed in conjunction with the source and drain regions of the PMOS transistor (42). The vertical PNP transistor (46) is laterally isolated from the other transistor devices by an annular ring formed from an N+ region (50c) formed in conjunction with an N+ DUF region (50a) used in the NPN transistor (40), and a N+ region (56b) formed in conjunction with an N+ collector region (56a) of the NPN transistor (40). An N+ DUF region (50b) may also be used in conjunction with the PMOS transistor (42).

9 Claims, 2 Drawing Sheets

METHOD OF MAKING VERTICAL PNP TRANSISTOR IN MERGED BIPOLAR/CMOS TECHNOLOGY

TECHNICAL FIELD OF THE INVENTION

This invention pertains in general to merged bipolar and CMOS technology, and more particularly to a high performance, low resistance, vertical PNP transistor structure and method of producing the same.

BACKGROUND OF THE INVENTION

In the area of linear circuit design (also known as "analog" circuit design), PNP transistors must inevitably be used along with their NPN counterparts. While NPN operating characteristics have been optimized, little effort has been provided to maximizing the operating characteristics of the PNP devices. As a result, the overall performance of the circuit is limited by the PNP behavior.

CMOS technology is generally a large part of any system. The effort to design large analog systems on a single chip requires front-end processes which can provide the needed high performance components. In previous systems, different technologies could be optimized on separate chips. However, when the entire system is integrated on one chip, the processes must be designed such that each technology is optimized.

Heretofore, the PNP transistor technology has been compromised in order to benefit the NPN and CMOS transistors. The two types of PNP devices available in most front-end processes for a merged bipolar and CMOS technology are the lateral PNP and the substrate PNP. These structures are deficient in many respects. First, they exhibit a low cut-off frequency due to their wide base regions. Second, the devices exhibit current gain roll-off at low to moderate current levels, due to the use of lightly-doped base regions. Third, the substrate PNP is not an isolated device, since it is configured such that the collector of each PNP transistor is the substrate. Thus, all substrate PNP devices on a single chip have a common collector. Fourth, the lateral PNP device requires a large amount of area in order to build the isolated structure. Fifth, both devices have relatively high series resistance in their collectors.

Therefore, a need has arisen in the industry for a technology which incorporates NPN transistors, CMOS technology, and high performance PNP transistors onto a single chip, without sacrificing the operating characteristics of the PNP device or unduly increasing the complexity of the manufacturing process. The PNP transistor should possess a high cut-off frequency, moderate current gain, isolated structure, and low series resistance.

BRIEF DESCRIPTION OF THE DRAWINGS

For a more complete understanding of the present invention and the advantages thereof, reference is now made to the following description taken in conjunction with the accompanying drawings in which.

SUMMARY OF THE INVENTION

The present invention disclosed and claimed herein describes a method and apparatus for a vertical PNP transistor in a merged bipolar/CMOS technology which substantially eliminates problems associated with prior PNP transistors.

In one aspect of the present invention, a vertical PNP structure for use in an integrated circuit having NPN, PMOS, and NMOS transistor structures comprises a P type collector region defined within a substrate region. An N type base region separates the emitter region from the collector region. The collector region is separated from the substrate by a first N type isolation region, and is laterally isolated from other transistor devices by a second isolation region. The second isolation region may be made in the same process steps as are used to form an N+ collector region and N+ DVF region for the NPN device. This aspect of the present invention provides the advantage that a vertical PNP transistor may be completely electrically isolated without adding additional processing steps to form the isolating barrier.

In a second aspect of the present invention, a vertical PNP structure is formed on an integrated circuit in conjunction with PMOS, NMOS and NPN structures, wherein an N type base region for the PNP structure is formed in the said processing step as is the N well region for the PMOS structure. Further, a N type collector region for the NPN structure may be formed in the same processing step. The source and drain regions of the PMOS structure may be formed in the same processing step as formed in the PNP emitter region. A base region for the NPN structure may be formed in the same processing step as forming the PNP emitter region. This aspect of the invention has the advantage that the number of steps required to form the PNP, PMOS, NMOS and NPN structures is minimized.

DETAILED DESCRIPTION OF THE INVENTION

The preferred embodiment of the present invention is best understood by referring to FIGS. 1–5 of the drawings, like numerals being used for like and corresponding parts of the various drawings.

Figure 1:
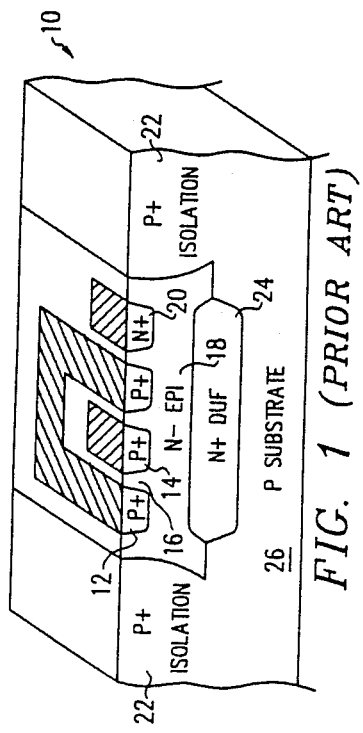
FIG. 1 illustrates a perspective view of a previously developed lateral PNP cross-section.

FIG. 1 illustrates a cross-section of a previously developed lateral PNP as used in a bipolar-based technology. The lateral PNP 10 has a P+ collector region 12 surrounding a P+ emitter region 14. Between the collector region 12 and the emitter region 14 lies the base region 16 comprising an N− epitaxy layer 18. An N+ contact region 20 provides a low resistance contact to the base region 16. P+ isolation regions 22 surround the N− epitaxy layer 18 to provide lateral isolation, and an N+ buried collector region or "diffusion under film" layer 24 (hereinafter N+ DUF 24) reduces parasitic substrate PNP effects for the lateral PNP 10.

In operation, charge present at the emitter 14 is transmitted to the collector 12 through the base region 16. The P+ isolation regions 22 provide isolation from the N− epitaxy regions of other transistors. The N+ DUF 24 provides a barrier between the N− epitaxy layer 18 and the P substrate 26 which would otherwise form a vertical PNP transistor, with the P substrate 26 acting as the collector.

The lateral PNP transistor 10 suffers from several inadequacies. Most importantly, the lateral nature of the transistor requires that the base region 16 between the collector 12 and the emitter 14 be relatively wide since it is very hard to control the width of the collector 12 and the emitter 14 during processing relative to controlling the depth of a diffused region. The wide base region 16 results in a low cut-off frequency at which the current gain of the transistor is less than unity. Furthermore, because of the lightly-doped base region 16 comprising the N− epitaxy layer 18, the lateral transistor 10 exhibits current gain rolloff at low to moderate current levels.

It is also desirable to maximize the sidewall area of the emitter which faces the collector. In the lateral PNP transistor 10, only the sides of the emitter 14 face the collector 12, with the collector 12 unable to collect a significant amount of the current injected at the bottom of the emitter 14. While the sidewall area can be increased by producing deep collector and emitter regions, the diffusion of the collector 12 and the emitter 14 will spread laterally as the depth of the regions are increased. Hence, the base region 16 must be made wider to accommodate the increased lateral spread, resulting in an increased amount of circuit area required to build the isolated lateral PNP structure.

Figure 2:
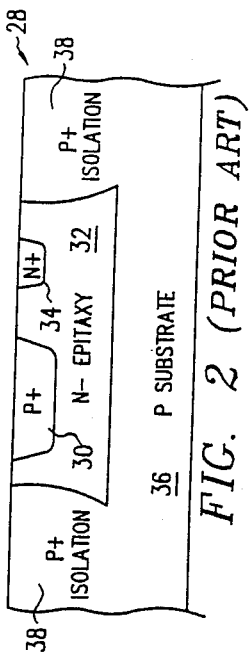
FIG. 2 illustrates a perspective view of a previously developed substrate PNP cross-section.

FIG. 2 illustrates a cross-section of another previously developed substrate PNP using bipolar-based technology. The substrate PNP transistor 28 has a P+ emitter region 30 diffused into a N− epitaxy region 32 which operates as the base. A N+ contact region 34 provides a low resistance connection to the N− epitaxy base region 32. The P substrate 36 acts as the collector, in conjunction with the P+ isolation region 38.

The substrate PNP 28 also suffers from a low cut-off frequency, since the width of the N epitaxy base region 32 is dependent upon the N− epitaxy thickness used in fabricating the collectors of the NPN transistors provided on the same integrated circuit, the NPN collectors being much deeper than is optimum for the base of a PNP transistor. Also, the substrate PNP transistor 28 exhibits current gain rolloff at low to moderate current levels, due to the use of the lightly-doped N− epitaxy base region 32.

Since the P substrate 36 is used as the collector of the substrate PNP transistor on a single integrated circuit, all of the PNP transistors of the integrated circuit will have a common collector, and hence will not be isolated from one another. Consequently, the substrate PNP transistor 28 is limited in usefulness for circuit design.

Figure 3:
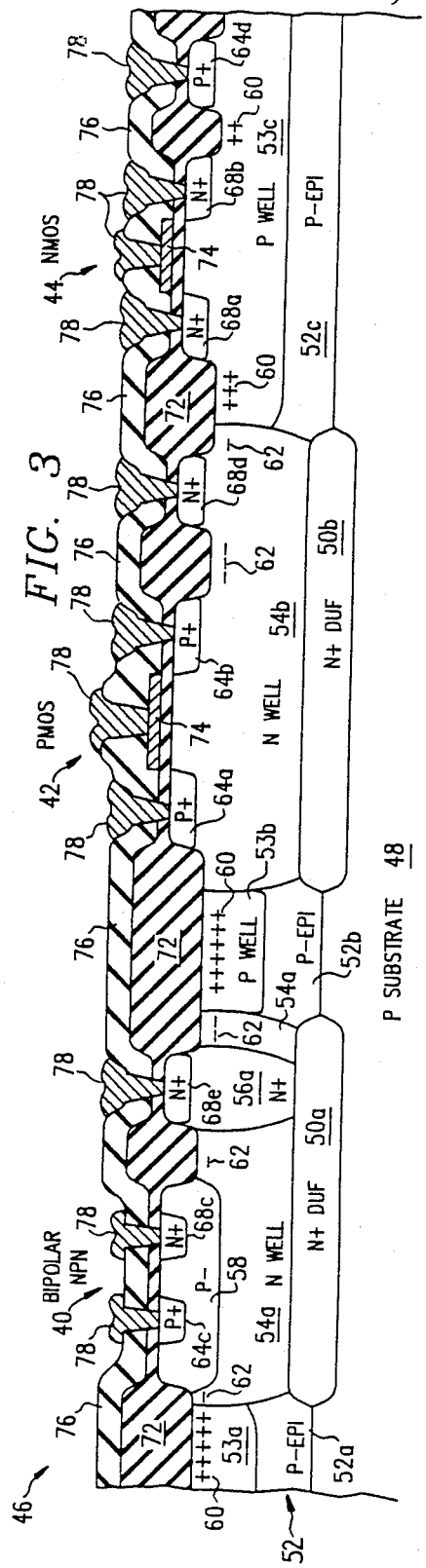
FIG. 3 illustrates a cross-sectional view of a merged bipolar/CMOS technology eminating from a N well based process.
Figure 4:
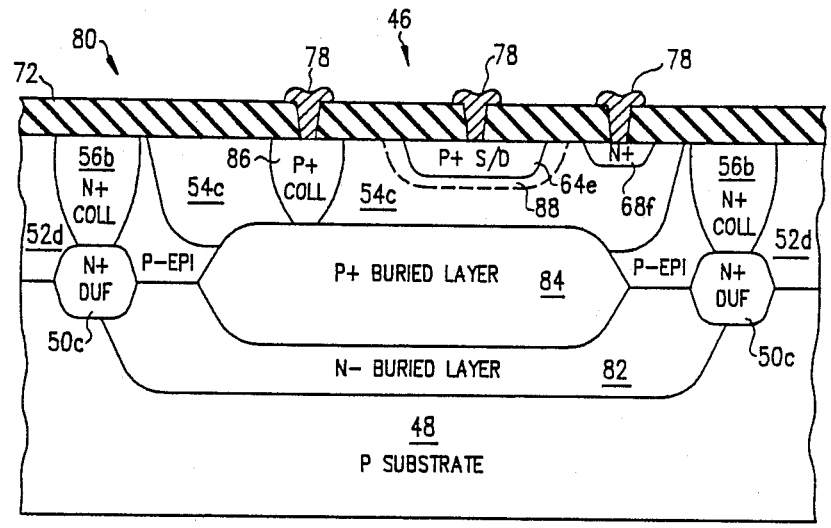
FIG. 4 illustrates a cross-sectional view of the vertical PNP transistor structure of the present invention.

Referring now to FIGS. 3 and 4, a vertical PNP transistor in accordance with the present invention for use with a N well-CMOS-based process is disclosed. FIG. 3 illustrates a bipolar NPN transistor 40, a PMOS transistor 42, and an NMOS transistor 44 disposed on an integrated circuit, generally referred to by reference numeral 46, using a merged bipolar/CMOS technology. The integrated circuit comprises a P substrate 48 having N+ DUF regions 50a-b diffused therein. A P− epitaxy layer 52 is deposited over the P substrate 48, and the N+ diffusion regions 50a-b. The N diffusion regions 50a-b diffuse upwards into the P− epitaxy layer 52, forming P− epitaxy regions 52a-c. Optionally, P well regions 53 are diffused into the P epitaxy region 52. N well regions 54a-b are diffused into the P− epitaxy layer 52 above the N+ diffusion regions 50a-b. N+ collector region 56a is diffused into the N well region 54a to make contact with the N+ DUF region 50a. A P− base region 58 is diffused into the N well region 54a. Channel stop layers 60 and 62 are implanted over the P well regions 53a-b and N well regions 54a-b as indicated by the "+" and "−" signs respectively.

A P+ diffusion produces P+ source/drain regions 64a-b (hereinafter P+ S/D 64a-b) in the N well region 54b of the PMOS transistor 42 to form the source and drain. The P+ diffusion is also used to form a P+ contact 64c in the P− base region 58 of the bipolar NPN transistor 40 and a backgate contact 64d in the NMOS transistor 44. An N+ diffusion forms source and drain regions 68a-b (hereinafter N+ S/D 68a-b) in the P well region 53c of the NMOS transistor 44. The N+ diffusion also forms the emitter region 68c in the NPN transistor 40, a backgate contact 68d in PMOS transistor 42 and a contact 68e with the N+ collector region 56a. A field oxide 72 is grown over the structure and polysilicon electrodes 74 are placed over the N well region 54b of the PMOS transistor 42 and the P well region 53c of the NMOS transistor 44. A multilevel oxide 76 is deposited over the field oxide 72 and the polysilicon electrodes 74. The multilevel oxide 76 and field oxide 72 are patterned and etched and metal electrodes 78 are connected to the P+S/D 64a-b N+S/D 68a-b, P+ contact 64c, emitter 68c, backgate contacts 64d and 68d, and N+ contact 68e.

In the illustrated embodiment of the merged bipolar/CMOS technology of FIG. 3, various diffusions are used to provide separate functions in each of the transistors. The N+ DUF region 50a provides a low collector series resistance for the NPN transistor 40 and the N+ DUF region 50b lowers the resistance under the N well 54b of the PMOS device 42, reducing latchup susceptibility. The N well regions 54b is used to house the PMOS transistor 42 and N well region 54a forms the collector region of the NPN transistor 40. The N+ diffusion used to form the source and drain regions 68a-b of the NMOS device 44 also forms the backgate contact 68d for the PMOS device 42, and the emitter 68c and N+ contact 68e of the bipolar NPN transistor 40. The P+ diffusion forming the source and drain regions 64a-b of the PMOS device 42 also forms the backgate contact 64d of the NMOS device 44 and the P+ contact 64c of the NPN transistor 40. The P well region 53c provides housing for the NMOS transistor 44 and the P well region 53b is used as an isolation region between the NPN transistor 40 and the CMOS transistors 42 and 44.

Referring to FIG. 4, a vertical PNP transistor is disclosed which may be used in conjunction with the bipolar/CMOS technology illustrated in connection with FIG. 3. In this illustration, like numerical references are used to illustrate regions which are preferably formed in conjunction with a process described in FIG. 3. The vertical PNP transistor 80 shares the P substrate 48 of the integrated circuit 46 of FIG. 3. A N− buried layer 82 is diffused into the P substrate 48. The N+ DUF region 50c is diffused into the N− buried layer 82 and the P substrate 48 to form an annular ring about the N− buried layer 82. A P+ buried layer 84 is diffused into the N− buried layer 82. The P− epitaxy region 52d is deposited above the P substrate 48 having diffused N DUF region 50c, N− buried layer 82 and P+ buried layer 84. After forming the P− epitaxy region 52d, the N+ DUF region 50c and P+ buried layer 84 will diffuse upwards into the P− epitaxy layer 52d.

N well base region 54c is diffused into the P− epitaxy layer 52d. N+ collector regions 56b are diffused into the P− epitaxy layer 52d above the N+ DUF region 50c, forming an annular region in conjunction with the N+ DUF region 50c. A P+ collector region 86 is diffused through the N well region 54c into the P+ buried layer 84. A P+ diffusion forms an emitter region 64e in the N well region 54c. An N+ diffusion provides a base contact 68f in the N well region 54c. An oxide layer 72 is deposited above the N well region 54c and P− epitaxy region 52d and is patterned and etched for providing metal electrodes 78 to the emitter region 64e, base contact 68f, and P+ collector 86. Optionally, an N− base region 88 may be diffused prior to forming the emitter region 64e in order to provide a more heavily doped base region below the emitter 64e for improving the current gain roll-off at high currents.

In an alternative embodiment, the P− base region 58 shown in FIG. 3 may be substituted for the P+ diffusion in order to provide a deeper emitter 64e, thus narrowing the width of the base region between emitter 64e and P+ buried layer 84.

The N− buried layer 82 may be formed by implanting and diffusing phosphorous into the P substrate 48 after patterning an oxide mask to define the boundaries of the N− buried layer 82. The P+ buried layer 84 may be produced by implanting and diffusing boron into the N− buried layer 82 after patterning an oxide mask defining its boundaries. The P+ collection region 86 may be formed by implanting and depositing boron into the N well region 54 using an oxide mask defining its boundaries.

In the disclosed process for forming the vertical PNP transistor 80 in the integrated circuit 46 along with bipolar and CMOS devices 40, 42 and 44, only three additional masks are required. The first additional mask is used to form the N− buried layer 82 which is used to vertically isolate the P− buried layer 84 from the underlying P substrate 48. The second additional mask is used to form the P+ buried layer 84, which provides a low collector series resistance for the isolated vertical PNP structure 80. The process used to form the P+ buried layer 84 could also be used to form a P+ buried layer beneath the NMOS devices 44 to lower their resistance, thereby reducing the latchup susceptibility of the NMOS devices 44. The third additional mask is used to define the P+ collector region 86, which contacts the P+ buried layer 84, providing a low collector series resistance for the isolated vertical PNP structure 80.

The remaining elements of the vertical PNP transistor may be provided for on the masks used in fabricating the NPN and CMOS devices 40, 42 and 44. The N+ DUF region 50c and N+ collector region 56b are used to provide lateral isolation for the vertical PNP structure 80 and can be formed in the same processing step used to form the N+ DUF region 50a beneath the NPN transistor 40. The N+ DUF diffusion may also be used to provide N+ DUF regions for reducing parasitic substrate PNP effects for isolated lateral PNP devices, such as described in connection with FIG. 1, if they are used in the integrated circuit design.

The N well diffusion forming the collector 54a for the NPN device 40 and forming the N well 54b housing the PMOS transistor 42 also forms the base region 54c of the vertical PNP transistor 80. The N well diffusion could also form a base region for an isolated lateral PNP or substrate PNP device, if desired.

The P+ diffusion of the source and drain regions 64a–b of the PMOS device 42 is used to form the emitter region 64e in the vertical PNP transistor 80 for the emitter section. Alternatively, the diffusion forming the P− base 58 of the NPN transistor 40 could be used to provide an emitter region having a greater depth, resulting in a higher gain and a higher cut-off frequency, with a possible lower operating voltage.

The diffusion forming the source and drain regions 68a–b of the NMOS device 44 can be used to form the contact 68f to the N well region 54c.

Since the boron used to form the P+ buried layer 84 will diffuse upwards into the N well region 54c approximately the same amount that it diffuses into the N− buried layer 82, the base width between the emitter region 64e and the P+ buried layer 84 can be made quite small. Based on an P− epitaxy thickness of about 6 to 7 microns, and an N well penetration of the P− epitaxy layer 52 of about 4 microns, the resultant base width of the vertical PNP between the emitter 64e and collector (P+ buried layer 84) will be approximately 2 microns or less. This provides a technical advantage of a significantly better cutoff frequency than present devices, with a higher gain.

The emitter-collector distance could be decreased even further by diffusing the P+ buried layer 84 for some distance prior to forming the N well base region 54c.

The use of the N− buried layer 82 provides the technical advantage of producing a vertical PNP transistor which is completely isolated from adjacent devices, allowing its use for all applications. Furthermore, trench isolation technology may be utilized in this process, allowing VLSI linear designs by reducing out-diffusions and depletion region spacing.

The P+ buried layer 84 and P+ collector region 86 provide the technical advantage of a low series collector resistance for the vertical PNP transistor 80. Also, an additional N− base region 88 would provide the technical advantage of raising the vertical PNP base doping level, thereby reducing the current gain roll-off at lower than desired currents. Additionally, the raised doping will raise collector to emitter punchthrough breakdown voltage.

Figure 5:
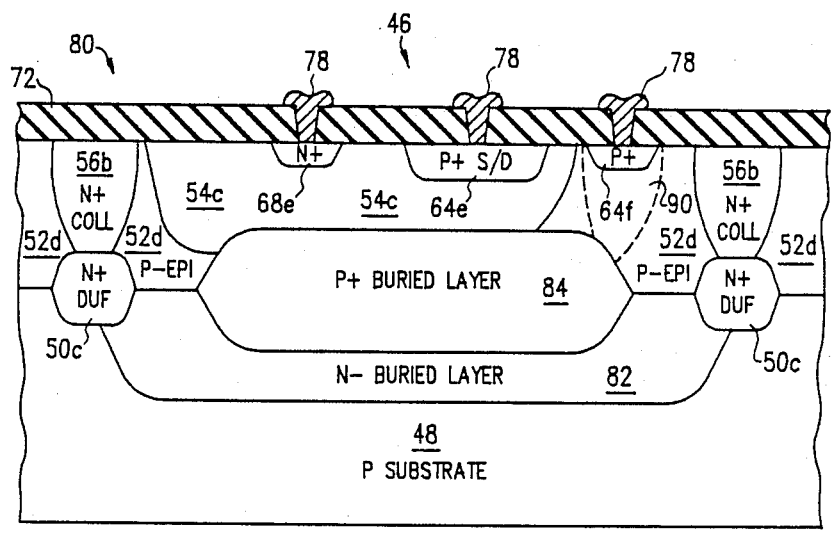
FIG. 5 illustrates a cross-sectional view of an alternative embodiment of the vertical PNP transistor structure of the present invention.

An alternative embodiment of the present invention is shown in FIG. 5. In this embodiment of the present invention the collector diffusion contact region is placed outside of the N well 54c, in the P− epitaxy 52d. Therefore, a shallow P+ S/D diffusion 64f could be used to make an electrical connection to the P+ buried layer 84 through the P− epitaxy 52d, if a low collector resistance is not necessary. By using the shallow P+ S/D diffusion 64f the complexity of the process can be reduced. The shallow P+ S/D diffusion 64f could be made in the same step as the other P+ regions 64a–e. Alternatively, a deep P+ collector diffusion region 90 could be formed, resulting in a lower collector series resistance. This embodiment also may have a higher collector-base breakdown voltage than the transistor of FIG. 4.

Although preferred embodiment of the invention has been described in detail, it should be understood that various changes, substitutions and alterations can be made therein without departing from the spirit and scope of the invention as defined by the appended claims.

What is claimed is:

1. A method for fabricating an isolated vertical PNP structure on an integrated circuit in conjunction with PMOS, and NPN structures, comprising the steps of:
   providing a P type substrate;
   forming an N− isolation region in said substrate at a location for said PNP structure;
   forming a first annular N+ isolation region in said substrate surrounding and in contact with said N− region while concurrently forming N+ buried regions for said NPN and PMOS structures;
   forming a P− eptaxial layer over said substrate;
   forming a P+ type collector region in said epitaxial layer for the PNP structure over said N− isolation region, said collector region being spaced from said first N+ isolation region by a region of said epitaxial layer;
   forming a N type base region for the PNP structure and an N well region for the PMOS structure in the same processing step;
   forming a second annular N+ isolation region in contact with said first N+ isolation region while concurrently forming a collector contact region for said NPN structure; and
   forming a P type emitter region for the PNP structure in said N type base region.

2. The method of claim 1 and further comprising the step of forming a N type collector region for the NPN structure in the same processing step as forming said PNP base region and said PMOS N well region.

3. The method of claim 1 and further comprising the step of forming source and drain regions of the PMOS structure in the same processing step as forming said PNP emitter region.

4. The method of claim 1, and further comprising the step of forming a base region for the NPN structure in the same processing step as forming said PNP emitter region.

5. A method as recited in claim 1 further comprising the steps of forming a P type collector contact region for said PNP structure by a selected one of:
   (i) forming a deep P+ diffusion through said N type base region to said P+ collector region; and
   (ii) forming a shallow P+ diffusion in said P− epitaxial layer between said N type base region and said second isolation region.

6. A method as recited in claim 1 wherein the step for forming said P type emitter region for the PNP structure is performed concurrently with a selected one of:
   (i) forming a P− base diffusion for said NPN structure and
   (ii) forming a P+ source/drain diffusion for said PMOS structure; and
   further comprising the step of forming a P type collector contact region for said PNP structure by a selected one of:
   (i) forming a deep P+ diffusion through said N type base region to said P+ collector region; and
   (ii) forming a shallow P+ diffusion in said P− epitaxial layer between said N type base region and said second isolation region.

7. A method as recited in claim 5 further comprising the step of forming a P+ collector contact region for said PNP structure by a selected one of:
   (i) forming a deep P+ diffusion through said N type base region to said P+ collector region; and
   (ii) forming a shallow P+ diffusion in said P− epitaxial layer between said N type base region and said second isolation region.

8. A method for fabricating a vertical PNP structure on an integrated circuit in conjunction with PMOS, NMOS and NPN structures, comprising the steps of:
   forming a P type substrate region;
   diffusing an N− isolation region into said substrate region;
   diffusing a P+ collector region for the PNP structure into said N− isolation region;
   forming a first N+ isolation region around said PNP collector region and an N+ region below the collector of the NPN structure in the same processing step;
   forming a second N+ isolation region around said PNP collector region and an N+ collector diffusion region for the NPN transistor in the same processing step;
   forming a P− epitaxy layer over said substrate; forming a N type base region for the PNP structure and a N type collector region for the NPN structure in the same processing step; and
   forming a P+ emitter region for the PNP structure and a P+ source and drain regions for the PMOS structure in the same processing step.

9. A method as recited in claim 7 wherein said N type base region of said PNP structure is formed in said P− epitaxial layer over said P+ collector region without contacting said first and second N+ isolation regions.

* * * * *